United States Patent [19]

Olmer

[11] Patent Number: 5,089,442

[45] Date of Patent: Feb. 18, 1992

[54] SILICON DIOXIDE DEPOSITION METHOD USING A MAGNETIC FIELD AND BOTH SPUTTER DEPOSITION AND PLASMA-ENHANCED CVD

[75] Inventor: Leonard J. Olmer, Orlando, Fla.

[73] Assignee: AT&T Bell Laboratories, Murray Hill, N.J.

[21] Appl. No.: 584,986

[22] Filed: Sep. 20, 1990

[51] Int. Cl.$^5$ .............. H01L 21/00; H01L 21/02; H01L 21/28; H01L 21/88

[52] U.S. Cl. .............................. 432/235; 437/50; 437/225; 437/228; 437/238; 427/38; 427/39; 427/47; 204/192.12; 204/192.15

[58] Field of Search ............... 437/50, 225, 228, 235, 437/238; 427/38, 39, 47; 204/192.12, 298.35

[56] References Cited

U.S. PATENT DOCUMENTS

| | | | |
|---|---|---|---|
| 3,934,060 | 1/1976 | Burk et al. | 427/95 |
| 4,290,187 | 9/1981 | Stein | 437/50 |
| 4,363,828 | 12/1982 | Brodsky et al. | 437/238 |
| 4,369,205 | 1/1983 | Winterling et al. | 427/47 |
| 4,487,162 | 12/1984 | Cann | 118/723 |
| 4,588,490 | 5/1986 | Cuomo et al. | 204/298 |
| 4,601,781 | 7/1986 | Mercier et al. | 437/238 |
| 4,668,365 | 5/1987 | Foster et al. | 427/47 |
| 4,714,536 | 12/1987 | Freeman et al. | 204/192.12 |
| 4,842,683 | 6/1989 | Cheng et al. | 204/298.35 |
| 4,872,947 | 10/1989 | Wang et al. | 204/298.35 |
| 4,876,983 | 10/1989 | Fukuda et al. | 118/722 |
| 4,882,198 | 11/1989 | Temple et al. | 427/38 |

FOREIGN PATENT DOCUMENTS 0162349 10/1982 Japan ........................ 437/238
0158516 9/1984 Japan ........................ 437/50

OTHER PUBLICATIONS

"SiO$_2$ Planarization Technology with Biasing and Electron Cyclotron Resonance Plasma Deposition for Submicron Interconnections", by K. Machida et al., *Journal of Vacuum Science Technology*, B4 (4), Jul./Aug. 1986, pp. 818-821.

"Sidewall-Tapered Oxide by Plasma-Enhanced Chemical Vapor Deposition", by G. C. Smith et al., *Journal of Electrochemical Society: Solid-State Science and Technology*, vol. 132, No. 11, Nov. 1985, pp. 2721-2725.

"Study of Planarized Sputter-Deposited SiO$_2$," C. Y. Ting et al., *Journal of Vacuum Science Technology*, 15(3), May/Jun. 1978, pp. 1105-1112.

Sze, S., *VLSI Technology*, p. 107, McGraw-Hill, 1983.

*Primary Examiner*—Brian E. Hearn
*Assistant Examiner*—B. Everhart
*Attorney, Agent, or Firm*—R. B. Anderson

[57] ABSTRACT

In plasma enhanced chemical vapor deposition (PECVD) of silicon dioxide on a substrate, voids and discontinuities are reduced by first depositing silicon dioxide in a sputter each chamber (22) in which a magnetic field is produced within the rf plasma for depositing the silicon dioxide. Simultaneous sputter etch and deposition occurs which inhibits net deposition at the corners of metal conductors over which the silicon dioxide is deposited. The substrate is then removed and transferred through a load lock (27) to a conventional PECVD deposition chamber (23).

11 Claims, 4 Drawing Sheets

SILICON DIOXIDE DEPOSITION METHOD USING A MAGNETIC FIELD AND BOTH SPUTTER DEPOSITION AND PLASMA-ENHANCED CVD

TECHNICAL FIELD

The invention relates to methods and apparatus for depositing silicon dioxide and, more particularly, to methods for depositing silicon dioxide over conductors of an integrated circuit having a relatively high aspect ratio.

BACKGROUND OF THE INVENTION

The technology of integrated circuits has been characterized by a continuing increase in the density with which devices can be formed in a silicon semiconductor chip or substrate. The interconnection of such high density devices requires the formation on the chip surface of conductors that are extremely small and spaced closely together, and conductive patterns that overlap, or, in the terminology of the technology, are vertically spaced at different conductor levels. The use of two or more levels of conductors requires a deposition of a dependable insulation such as silicon dioxide on the lower or first level of conductors of that the overlying upper level or second level can be made without the risk of accidental short circuits or other conductive anomalies.

A favored method for depositing silicon dioxide is known as plasma enhanced chemical vapor deposition (PECVD) in which a ratio-frequency plasma contains a silicon component and an oxygen component. The plasma provides energy for enhancing the reaction required for silicon dioxide formation at temperatures below the melting point of the first level of conductors over which the deposition is made. It should be noted that other oxides such as silicon monoxide may be deposited by this process, but the predominant deposited material is silicon dioxide, which is the term that will be used herein. Also, deposition is on a "substrate," which may be part of the semiconductor, the metal conductors, or previously deposited or grown silicon dioxide.

As circuit density increases, the ratio of the height of adjacent conductors to their separation distance, known as the aspect ratio of the structure, also increases. If the thickness of the deposited silicon dioxide is greater than half the separation between adjacent conductors, the silicon dioxide deposited on adjacent vertical walls of adjacent conductors is likely to meet and cause a discontinuity in the deposited silicon dioxide. If the top corner coverage is slightly greater than the coverage on the remainder of the vertical sidewalls, the corners may meet first, thus producing a void within the deposited silicon dioxide between adjacent conductors. This problem becomes more pressing as the aspect ratio increases.

One solution to the problem is the use of electron cyclotron resonance (ECR) as described, for example, in the paper, "SiO$_2$ Planarization Technology with Biasing and Electron Cyclotron Resonance Plasma Deposition for Submicron Interconnections," Katsuyuki Machida et al., *Journal of Vacuum Science Technology B4* (4), July/August 1986, pp. 818-821. In a chamber connected to the deposition chamber, the combination of an applied microwave frequency and magnetic field sets up a cyclotron resonance of ions which are directed into the deposition chamber and cause silicon dioxide to deposit. The addition of a wafer rf bias in the deposition chamber causes the silicon dioxide to sputter etch, resulting in deposition at different angles on the substrate, thereby to reduce the problem of voids caused by merging vertical walls. One problem with this approach is that it requires the design of new equipment, it is more difficult to maintain the standards of ultracleanliness required in chip manufacture, and the need for microwave and a separate ECR chamber complicate and increase the cost of the apparatus for manufacture.

The paper, "Sidewall-Tapered Oxide by Plasma-Enhanced Chemical Vapor Deposition," G. C. Smith et al., *Journal of Electrochemical Society: Solid-State Science and Technology*, Vol. 132, No. 11, November 1985, pp. 2721-2725, describes another approach in which sputtering is induced concurrently with silicon dioxide deposition. This leads to V-shaped sidewalls of the deposited silicon dioxide, rather than vertical sidewalls that merge to create voids. A problem with this approach is the relatively long time period required for depositing a useful layer of silicon dioxide over a conductor pattern having a relatively high aspect ratio.

The copending application of Lory et al., Ser. No. 386,650, filed July 31, 1989, describes still another approach to the problem in which an inhibiting gas is use in the plasma that inhibits silicon dioxide deposition on the vertical sidewalls. This gives deposition preferentially on the horizontal features of the structure and prevents voids as long as the aspect ratio is not too high. It works quite well with aspect ratios of lower than 1.0, but, with new circuits, aspect ratios are desired that are as high as 1.7, for which the Lory et al. approach appears to be less than completely reliable.

There is therefore a continuing need in industry for a method for depositing dependable layers of silicon dioxide over conductor patterns having high aspect ratios in a manner that is amenable to mass production, is consistent with cleanliness requirements, and which does not greatly increase the cost of manufacture.

SUMMARY OF THE INVENTION

Equipment is available on the market for sputter etching a wafer in one chamber and then moving it to another chamber for silicon dioxide deposition. I have found that, with practical modifications, such equipment can expediently be used to deposit silicon dioxide over conductors having high aspect ratios. In the modified sputter etch chamber, an rf plasma is formed for depositing a layer of silicon dioxide. A magnetic field extends through the wafer and plasma, in a direction generally transverse to the rf field. Simultaneous sputter etching and deposition occurs which inhibits net deposition on the corners of the first level conductors; this results in a generally V-shaped surface to the deposited silicon dioxide between adjacent conductors. This could constitute the entire deposition, but preferably the substrate is removed and transferred to the conventional deposition chamber. Here, a generally conformal second layer of silicon dioxide is formed over the previously deposited layer but, because of the configuration of the first silicon dioxide layer, there can be no problems of voids or other discontinuities. Thereafter, the upper surface is planarized and the second level of conductors is deposited.

The method which has been briefly described yields a reliable silicon dioxide insulation layer is a manner which is consistent with mass production and operation by workers of moderate skill. No problems of cleanliness are introduced because the equipment that is used is, for the most part, commercially available equipment that has been designed to meet modern standards of cleanliness. As will become clear form the detailed description, that is little added cost to the apparatus or method which is used in obtaining the silicon dioxide dielectric layers. These and other objects, features and benefits of the invention will be better understood from a consideration of the following detailed description taken in conjunction with the accompanying drawing.

DETAILED DESCRIPTION

Figure 1:
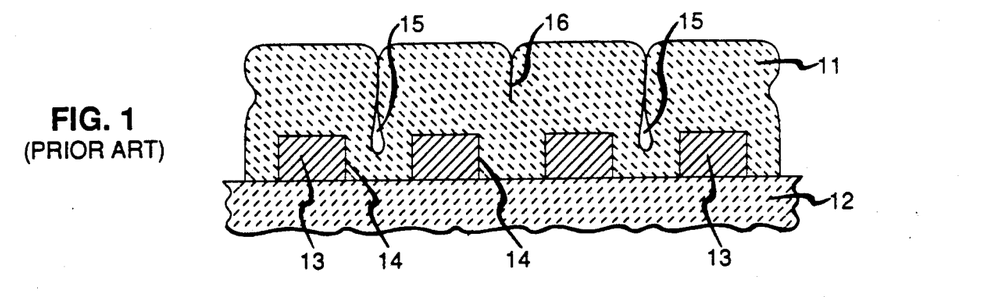
FIG. 1 is a schematic view of silicon dioxide deposited over metal conductors in accordance with the prior art.

Referring now to FIG. 1, there is illustrated schematically the prior art deposition of silicon dioxide 11 on a substrate 12, which creates the problem with which the invention is concerned. Located on the top surface of the substrate 12 are conductors 13, which illustratively constitute the first conductor level of an integrated circuit. The aspect ratio of the conductors is defined as the ratio of the height of the vertical sidewalls 14 of the conductors to the separation distance of adjacent vertical sidewalls of adjacent conductors. With conventional conformal deposition, a high aspect ratio results in the silicon dioxide on adjacent vertical walls growing together. The corners of the deposited silicon dioxide are likely to meet first, which results in voids 15 in the deposited oxide layer. Even if voids are not formed, discontinuities 16 are created, which adversely affect the etch characteristics and insulation characteristics of the silicon dioxide layer. One can appreciate that as the aspect ratio increases, the problems accompanying conformal silicon dioxide deposition generally increase.

Figure 2:
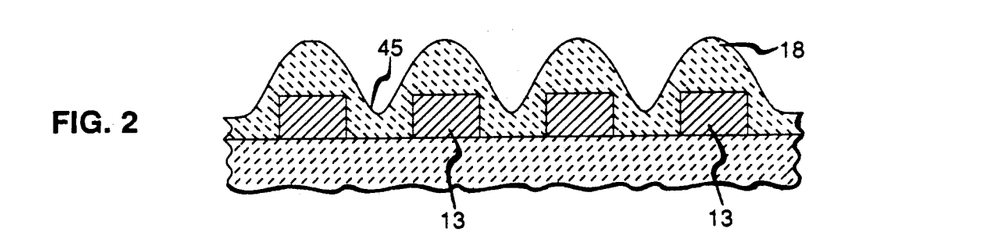
FIGS. 2, 3 and 4 are schematic views illustrating successive steps of silicon dioxide dielectric formation in accordance with an illustrative embodiment of the invention.
Figure 3:
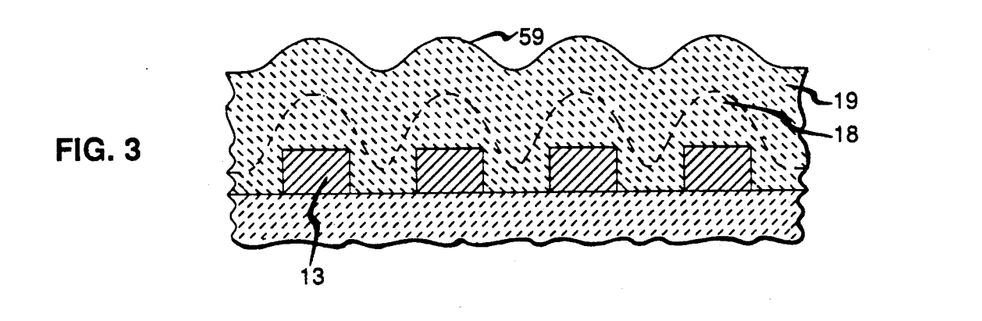
Figure 4:
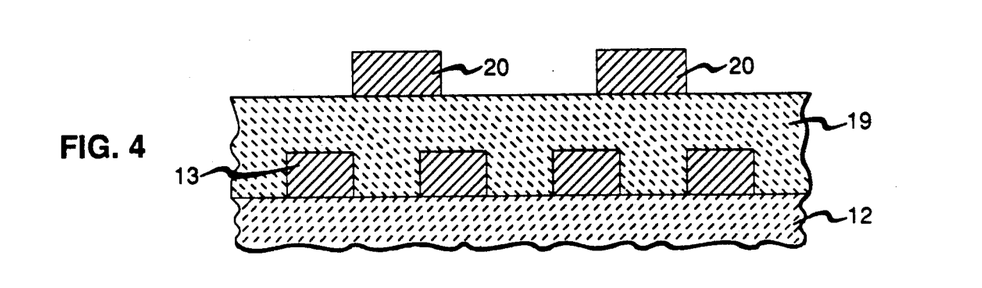

Referring to FIG. 2, in accordance with the invention, the silicon dioxide is formed in two steps. First, a first silicon dioxide layer 18 is formed, which has generally a V-shaped configuration between adjacent conductors 13 as shown. Then, as shown in FIG. 3, a second silicon dioxide layer 19 is formed over the first silicon dioxide layer, which is generally conformal and therefore has a succession of V-shapes in its upper surface as shown. FIG. 4 shows the silicon dioxide layer planarized so as to permit the formation of conductors 20 on its upper surface, which constitutes the second conductor level of the integrated circuit device being made.

Figure 5:
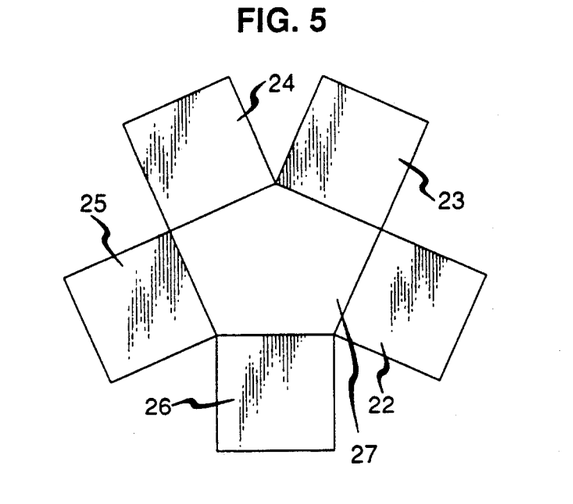
FIG. 5 is a schematic view of certain commercially available equipment that can be modified to be used in accordance with the invention.

An important aspect of the inventive method is that it can be practiced through the use of commercially available chemical vapor deposition (CVD) equipment. Specifically, FIG. 5 illustrates schematically apparatus known as the "Precision 5000 System," commercially available from the Applied Materials Company of Santa Clara, Calif., which may be used for the practice of the invention. This system includes separate chambers 22-25 interconnected by a central transfer chamber 27. Wafers are introduced into a load lock chamber 26 and are transferred among various chambers by a robot arm contained in a transfer chamber 27. These individual chambers can be used for different operations on semiconductor wafers while maintaining high standards of cleanliness and avoiding cross contamination from one chabmer to the other. By using separate chambers to deposit layers 18 and 19 (of FIG. 3), one can optimize the parameters to obtain the highest possible overall deposition rate, or, in other words, to reduce as much as possible the overall time required for the entire process.

Figure 6:
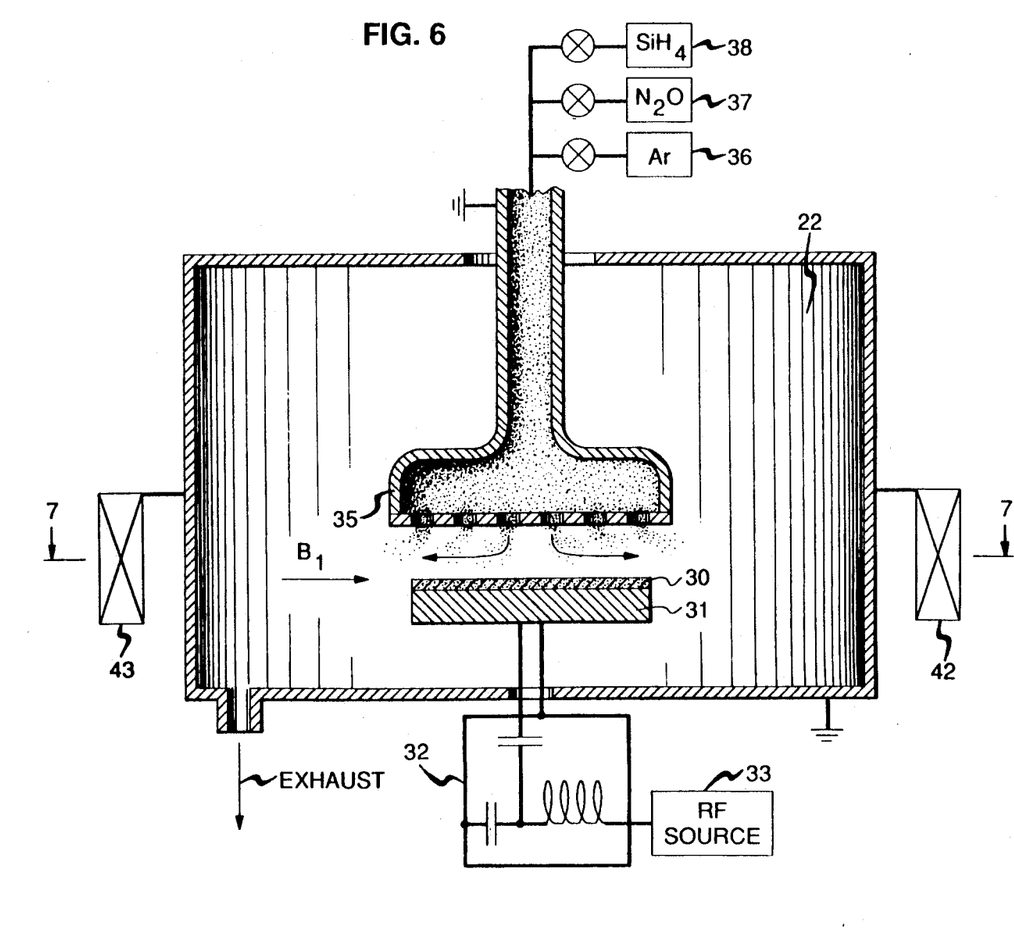
FIG. 6 is a schematic view of one modified reactor chamber in the apparatus of FIG. 5.

FIG. 6 is a schematic sectional view of the chamber 22 of FIG. 5 used for depositing the first silicon dioxide layer 18 of FIG. 2. A wafer 30 is mounted on an electrode 31 connected through a matching network 32 to a radio-frequency source 33. A grounded electrode 35 opposite the wafer 30 constitutes a source of gas for forming an rf plasma between electrodes 35 and 31. The grounded electrode 35 is hollow and contains a plurality of apertures that permit the flow of injected gas as shown by the arrows. The gas is taken from a source of argon 36, a source of nitrogen oxide 37 and a source of silane 38. Appropriate valves and transmission lines permit a mixture of these gases to be directed into the region between the electrodes 35 and 31.

Figure 7:
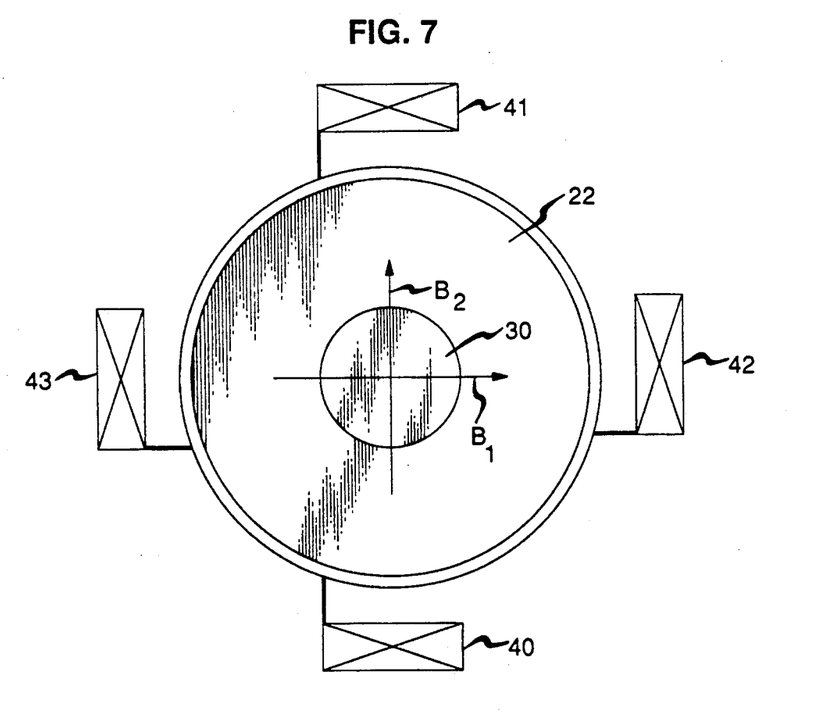
FIG. 7 is a view taken along line 7—7 of FIG. 6.

As can be seen in FIG. 7, four coils 40 through 43 are located in quadrature around the chamber 22. The intended purpose of the chamber 22, as part of the "Precision 5000 System," is to sputter etch material from wafers, rather than deposit the material on wafers. To this end, the coils produce a magnetic field through the wafer generally parallel with the upper surface of the wafer 30 and they promote sputter etching by increasing the density of impinging ions on the wafer surface. Coils 42 and 43 are connected together and, when current through them is at a maximum, they produce a magnetic field $B_1$ shown in FIGS. 6 and 7. Interconnected coils 40 and 41 produce a magnetic field $B_2$ when they carry current to the maximum. By directing current at a low alternation frequency through the coils, with the current through coils 42 and 43 being displaced ninety degrees from the current through coils 40 and 41, one can create a magnetic field of uniform strength B which rotates in a plane parallel to the upper surface of the wafer 30. Preferably, the current is varied through the coils such that the magnetic field B remains of constant total strength and rotates with a frequency of one rotation for each two seconds although a frequency as high as one hundred rotations per second could be used.

Prior to deposition, argon is introduced into the system and the rf power is applied so as to heat the wafer 30. Thereafter, gas from sources 37 and 38 are introduced. Nitrogen oxide, $N_2O$, constitutes a source of oxygen, and silane, $SiH_4$, constitutes a source of silicon which are reacted to deposit silicon dioxide on the upper surface of the water in accordance with the principles of PECVD. As will be explained later, these gases are chosen so as to enhance sputtering from the surface of wafer 30 as well as to constitute sources for deposition of silicon dioxide onto wafer 30. The wafer 30 is supported on an electrode 31 which is rf driven and is smaller in area than electrode 35. The total pressure within the chamber 22 is low and the rate of silicon dioxide deposition is relatively low. Together with the magnetic field, these choices of parameters tend to enhance sputtering.

Referring again to FIG. 2, it is desired in the apparatus of FIGS. 6 and 7 to deposit silicon dioxide 18 having an upper surface 45 that is generally V-shaped between successive conductors 13. This is accomplished because sputtering occurs predominantly at the corners of conductors 13, which results in a net thickness of deposition that is lowest at the corners. Thus, in effect, we deposit at a rate that is balanced with respect to the rate of removal by sputtering so as to give a minimum net deposition at the corners of conductors 13. I have found that using parameters designed to a give a sputtering rate of three hundred angstroms per minute and a silicon dioxide deposition rate of one through angstroms per minutes will yield a net deposition rate of seven hundred angstroms per minute and will yield the upper surface 45 shown in FIG. 2. The rotation of the magnetic field B enhances uniformity of deposition.

Figure 8:
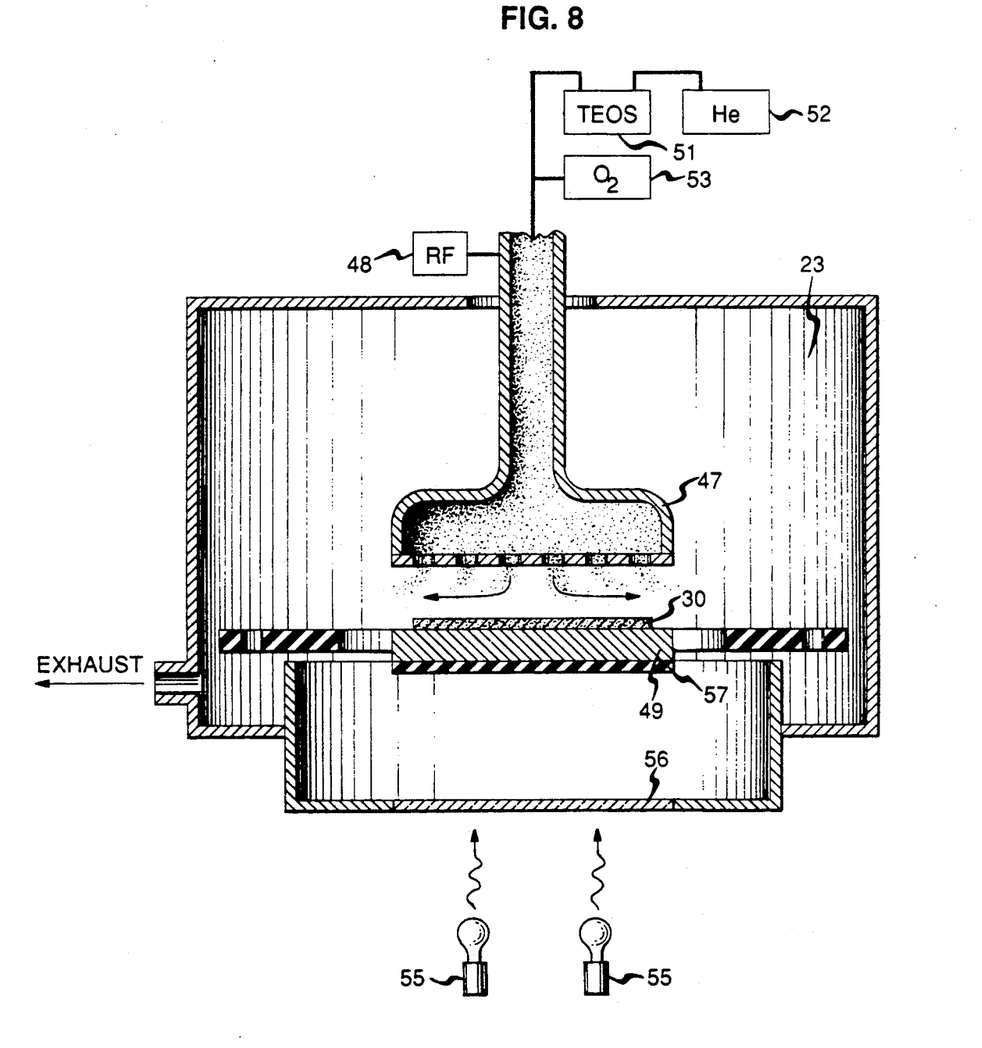
FIG. 8 is a schematic view of another reactor chamber of the apparatus of FIG. 5.

Referring again to FIG. 5, after completion of the silicon dioxide deposition in chamber 22, the wafer is removed to transfer chamber 27 and then to chamber 23, which is shown schematically in FIG. 8. In chamber 23, the upper electrode 47, rather than the lower electrode is driven by an rf source 48 (the matching network is not shown for purposes of brevity). The water 30 rests on a grounded electrode 49. As before, gases are directed through electrode 47 toward the wafer 30, but different gas compositions are used. The silicon component of the silicon dioxide is obtained from gaseous tetraethoxysilane (TEOS) derived from a heated liquid source 51. Typically, TEOS is commercially available as a liquid and a vaporized form is obtained by bubbling helium from a source 52 through the liquid TEOS and deriving vaporized molecules from the TEOS container as indicated schematically. Also included in the plasma atmosphere is pure oxygen gas from source 53. Various known valves and metering equipment are not shown for brevity.

The lower electrode 49 is heated by a plurality of lamps 55 that direct light through a quartz window 56 so as to impinge on an aluminum oxide layer 57 of electrode 49. This heats the water to a temperature below the melting point of the metal conductors contained on its surface.

In the configuration of chamber 23, the gas composition of the plasma atmosphere and the various other parameters are chosen so as to maximize the silicon dioxide deposition rate. The copending application of Dean et al. Ser. No. 175,567, filed Mar. 31, 1988, hereby incorporated herein by reference, describes the advantages of using tetraethoxysilane (TEOS) together with oxygen as the plasma deposition atmosphere in a PECVD process. Referring to FIG. 3, this process yields conformal coating 19 having an upper surface 59 that corresponds generally to the upper surface 45 of the silicon dioxide layer 18 of FIG. 2. One can appreciate that with the silicon dioxide deposition at a generally equal rate on all surfaces, there is not likely to be a problem of adjacent sidewalls growing together with consequent formation of voids as was described with reference to FIG. 1. The upper surface of silicon dioxide layer 19 is then planarized in a known manner to yield the silicon dioxide layer 19 of FIG. 4 upon which one may then deposit the second level of conductors 20. Alternatively, the silicon dioxide 19 may be ground to a horizontal level equal to the top level of conductors 13 using the top surface of the conductors as a "stop" to the grinding operation. Thereafter, another silicon dioxide layer is deposited in the chamber 22 of FIG. 6 it yield a silicon dioxide layer having a flat upper surface. As still another option, etching may be used to planarize the upper surface of deposited layer 19.

Referring again to FIG. 2 it can be appreciated that the crux of the invention lines in depositing a first silicon dioxide layer 18 having the upper surface 45 generally as shown. The vertical walls are prevented from growing together by depositing the silicon dioxide 18 so as to have V-shaped upper surfaces between successive conductors which, in turn, requires a balance between removal of material by sputtering and deposition of silicon dioxide by PECVD. Table I below shows the parameters that were used in both chamber 22 and 23 for covering conductors having aspect ratios up to 1.7. The table also shows the parameters used in chamber 23 for increasing the deposition rate of the silicon dioxide.

TABLE I

| Parameter | Chamber 22 | Chamber 23 |
|---|---|---|
| RF Power | 500 watts | 450 watts |
| Pressure | 30 millitorr | 9 torr |
| Magnetic Field | 130 gauss | 0 |
| Argon | 180 sccm | 0 |
| $N_2O$ | 20 sccm | 0 |
| $SiH_4$ | 8 sccm | 0 |
| $SiO_2$ Deposition Rate | 700 A/min | 125 A/sec |
| TEOS | 0 | 500 sccm |
| $O_2$ | 0 | 500 sccm |
| Electrode Spacing | 6–8 inches | 200 mils |

Table I demonstrates the radically different conditions for silicon dioxide deposition in chamber 22 with respect to that in chamber 23. In the table, A means angstrom units and sccm means standard cubic centimeters per minutes. Many experiments have demonstrated to me that the desirable objective of depositing in chamber 22 is to maximize the sputtering rate, because the rate at which the silicon dioxide can be deposited is limited by the rate at which it must be sputtered away from the corners of the conductors; the time taken for the overall process is reduced by increasing both the sputtering and deposition rates in chamber 22. Thus, to maximize sputtering rate, argon is used to increase the mass of impinging ions on the surface of the wafer. A much lower pressure is used in chamber 22 (between one and one hundred millitorr) than in chamber 23 (between about one and twenty torr). The electrode 31 of chamber 22 is made smaller than electrode 35 and is driven by the rf source 33 in order to a maximize the energy of ion impingement on the wafer surface. The magnetic field greatly increases sputtering rate and therefore greatly improves the efficiency of chamber 22. One hundred thirty gauss was the highest magnetic field that could be obtained in the system used; it appears that this value should be significantly increased to speed up the overall process. Silane as the silicon source and $N_2O$ as the oxygen source further enhance the sputtering component. A high rf power in chamber 22 (i.e., power in excess of at least one hundred watts) is preferred to maximize sputtering and, in fact, the rf power and the magnetic field are perhaps the two most important parameters for increasing the sputtering component. Of course, TEOS, $O_2$, and other alternative gases could be used in chamber 22, but the process window for good quality films is much narrower with these gases in chamber 22. In chamber 23, one wishes to maximize the deposition rate and so TEOS and $O_2$ are appropriate choices. By maximizing the sputtering rate in chamber 22, one minimizes the time needed to establish the configuration of FIG. 2. Thus, in the embodiment described, the deposition rate in chamber 23 is 125 angstroms per second and in chamber 22 the rate is only 700 angstroms per minute. In the chamber 23, no effort is made to make the electrode 49 that supports wafer 30 smaller than the electrode 47 and the electrode spacing is only 200 mils because that is no need for any sputtering component.

In the "Precision 5000 System" that was used, a pair of quartz rings and a graphite ring that surrounded electrode 31 of chamber 22 were removed. Other minor structural changes were made, but essentially full advantage was taken of the commercially available system for processing semiconductor wafers with a high throughput. The diameter of electrode 31 was adjusted to be approximately equal to that of the wafer 30 (six inches). The purpose of these changes was to make as uniform as possible the plasma distribution over the upper surface of the wafer, and as mentioned before it appears that substitute coils should be used to give a higher rotating magnetic field.

The various parameters which are described merely illustrate in one embodiment the optimum choices for balance sputtering with deposition. Various other gases could be used in which case the parameters should be adjusted accordingly. Only a single chamber could be used for making both depositions, but in that case more compromises in apparatus structure would have to be made. It is not essential that the magnetic field rotate if one can tolerate non-uniform deposition and density. Various other embodiments and modifications may be made by those skilled in the art without departing from the spirit and scope of the invention.

I claim:

1. A method for making integrated circuits comprising the steps of:
    forming a first conductive pattern over a semiconductor substrate, cross-sectional areas of component conductors of the pattern each having two upper corners;
    placing the substrate on a first electrode of a first chamber, the chamber including a second electrode;
    introducing into the first chamber inert gas and gas including silicon and oxygen components;
    causing first silicon dioxide to deposit on a first surface of the substrate comprising the step of producing a first rf electric field between the first and second electrodes;
    during the first silicon dioxide deposition, causing the sputtering of certain silicon dioxide predominantly from the upper corners of component conductors comprising the step of producing, along the first surface of the substrate, a magnetic field that is substantially perpendicular to the rf field;
    withdrawing the substrate from the first chamber and placing it on a first electrode of a second chamber, the second chamber including a second electrode;
    introducing into the second reaction chamber gas including silicon and oxygen components;
    causing second silicon dioxide to deposit over the first silicon dioxide comprising the step of producing a second rf electric field between the first and second electrodes of the second chamber, said last mentioned deposition being in the absence of any magnetic field and at a higher deposition rate than the first silicon dioxide deposition.

2. The method of claim 1 further comprising the step of:
    planarizing an upper surface of the deposited second silicon dioxide;
    and forming a second conductive pattern on the planarized second silicon dioxide surface.

3. The method of claim 2 wherein:
    the frequency of the rf energy in both the first and second chambers is less than about five hundred megahertz.

4. The method of claim 3 wherein:
    in the first chamber, the first electrode is excited with rf energy and the second electrode is grounded and in the second chamber, the second electrode is excited with rf energy and the first electrode is grounded;
    and in both chambers, the rf power exceeds about one hundred watts.

5. The method of claim 4 wherein:
    the magnetic field exceeds about one hundred gauss and, during deposition in the first rf reactor chamber, the magnetic field rotates about an axis substantially parallel to the rf field but maintains a substantially constant strength.

6. The method of claim 5 wherein:
    the atmosphere of the first chamber during deposition of the first silicon dioxide layer contains argon, silane and nitrogen oxide, and the atmosphere of the second chamber during deposition of the second silicon dioxide layer contains TEOS and oxygen and no argon.

7. The method of claim 6 wherein:
    the gas pressure in the first chamber during deposition of the first silicon dioxide is between about one and one hundred millitorr;
    the gas pressure in the second chamber during deposition of the second silicon dioxide is between about one and twenty torr;
    the spacing of the first and second electrodes in the first chamber is more than about ten times greater than the spacing between the first and second electrodes and the second chamber.

8. The method of claim 7 wherein:
    the first conductor pattern has an aspect ratio greater than about 1.0.

9. A method for making an integrated circuit comprising the steps of:
    forming a first conductor pattern on a substrate, at least part of the conductor pattern being defined by conductors each having exposed corners, adjacent conductors having an aspect ratio greater than about 1.0;
    forming over the first conductor pattern a first layer of silicon dioxide;
    said first layer of silicon dioxide being formed by deposition from a first rf plasma containing silicon, a group VIII gas and oxygen components;
    the rf power and other parameters of the first rf plasma being selected to give significant preferential sputtering of silicon dioxide from exposed corners of conductors of first conductor pattern as the first silicon dioxide layer is being deposited, thereby leading to substantially V-shaped silicon dioxide surfaces between adjacent conductors of the conductor pattern;

forming over the first silicon dioxide layer a second silicon dioxide layer;
said second silicon dioxide layer being formed by depositing silicon dioxide from a second rf plasma containing silicon and oxygen components;
the rf power and other parameters of the second rf plasma being selected so as to give insignificant sputtering of silicon dioxide material during deposition of the second silicon dioxide layer, whereby the upper surface of the second silicon dioxide layer generally conforms to the upper surface of the first silicon dioxide layer.

10. The method of claim 9 wherein:
during formation of the first layer of silicon dioxide, a magnetic field is made to extend through the first rf plasma and through the substrate.

11. The method of claim 10 wherein:
during formation of the first layer of silicon dioxide, the substrate is located in a first reactor and is in contact with an rf electrode;
and during formation of the second layer of silicon dioxide, the substrate is located in a second reactor and is in contact with a grounded electrode.

* * * * *

UNITED STATES PATENT AND TRADEMARK OFFICE
CERTIFICATE OF CORRECTION

PATENT NO. : 5,089,442

DATED : February 18, 1992

INVENTOR(S) : Leonard J. Olmer

It is certified that error appears in the above-indentified patent and that said Letters Patent is hereby corrected as shown below:

On the Title page, item [54], col. 1, lines 1-4 (2nd occurrence)

In the Title, "Silicon Dioxide Deposition Method Using a Magnetic Field and Both Sputter Deposition and Plasma-Enhanced CVD" should read --Silicon Dioxide Deposition Method Using a Magnetic Field and Both Plasma-Enhanced CVD and Sputtering--. Column 1, line 26, "of" should read --so--; Column 1, line 32, "ratio-frequency" should read --radio-frequency--; Column 2, line 8, "wave" should read --waves--; Column 2, line 24, "use" should read --used--; Column 2, line 66, "is" should read --in--. Column 3, line 4, "form" should read --from--; Column 3, line 5, "that" should read --there--; Column 4, line 10, "chabmer" should read --chamber--; Column 4, line 60, "water" should read --wafer--. Column 5, line 15, "through" should read --thousand--; Column 5, line 26, "water" should read --wafer--; Column 5, line 43, "water" should read --wafer--; Column 5, line 55, "yields conformal" should read --yields a conformal--; Column 5, line 58, "deposition" should read --depositing--; Column 6, line 2, "it" should read --to--; Column 6, line 7, "lines" should read --lies--; Column 6, line 15, "chamber" should read --chambers--; Column 6, line 38, "minutes" should read --minute--; Column 6, line 52, "order to a maximize" should read --order to maximize--. Column 7, line 11, "that" should read --there--.

Signed and Sealed this

Fifteenth Day of June, 1993

MICHAEL K. KIRK

*Attest:*

*Attesting Officer*

Acting Commissioner of Patents and Trademarks